(12) United States Patent
Lin

(10) Patent No.: US 11,060,921 B2
(45) Date of Patent: Jul. 13, 2021

(54) OPTICAL MODULE COMPRISING FIRST OPTICAL COMPONENT AND SECOND OPTICAL COMPONENT AND INFRARED THERMOMETER COMPRISING OPTICAL MODULE

(71) Applicant: QISDA CORPORATION, Taoyuan (TW)

(72) Inventor: Chih-Ying Lin, Taipei (TW)

(73) Assignee: QISDA CORPORATION, Taoyuan (TW)

( * ) Notice: Subject to any disclaimer, the term of this patent is extended or adjusted under 35 U.S.C. 154(b) by 34 days.

(21) Appl. No.: 16/521,602

(22) Filed: Jul. 25, 2019

(65) Prior Publication Data
US 2020/0393302 A1 Dec. 17, 2020

(30) Foreign Application Priority Data
Jun. 14, 2019 (CN) .......................... 201910513692.2

(51) Int. Cl.
| | | |
|---|---|---|
| *G01J 5/02* | (2006.01) |
| *G01J 5/04* | (2006.01) |
| *G01J 5/08* | (2006.01) |
| *G01J 5/10* | (2006.01) |
| *G02B 7/00* | (2021.01) |
| *H01S 3/02* | (2006.01) |
| *H01S 5/022* | (2021.01) |

(52) U.S. Cl.
CPC ................. *G01J 5/08* (2013.01); *G01J 5/025* (2013.01); *G01J 5/04* (2013.01); *G01J 5/047* (2013.01); *G01J 5/0893* (2013.01); *G01J 5/10* (2013.01); *G02B 7/00* (2013.01); *H01S 3/02* (2013.01); *H01S 5/022* (2013.01)

(58) Field of Classification Search
CPC .......... G01J 5/02; G01J 5/0205; G01J 5/0265; G01J 5/04; G01J 5/047; G01J 5/10; G01J 5/025; G01J 5/0275; G01J 5/08; G01J 5/089; G01J 5/0893; G01J 5/0896
USPC ................. 250/338.1, 338.4, 339.01, 339.02
See application file for complete search history.

(56) References Cited

U.S. PATENT DOCUMENTS

| | | | | |
|---|---|---|---|---|
| 4,315,150 A | * | 2/1982 | Darringer | ................. G01J 5/08 250/338.1 |
| 5,094,544 A | * | 3/1992 | Ignatowicz | ............... G01J 5/02 250/347 |
| 5,368,392 A | * | 11/1994 | Hollander | ............. G01J 5/0809 374/121 |
| 6,095,682 A | * | 8/2000 | Hollander | ............. G01D 21/02 374/121 |

(Continued)

FOREIGN PATENT DOCUMENTS

| | | |
|---|---|---|
| CN | 201000671 Y | 1/2008 |
| JP | 5620704 B2 | 11/2014 |

*Primary Examiner* — Allen C. Ho
(74) *Attorney, Agent, or Firm* — Winston Hsu

(57) ABSTRACT

An optical module includes a base, a first optical component and at least two washers. The first optical component is disposed on the base and the first optical component has a flange. The washers are disposed on the first optical component and sandwiched in between the base and the flange. Each of the washers has a first side surface and a second side surface, wherein the first side surface and the second side surface tilt with respect to each other by an angle.

22 Claims, 11 Drawing Sheets

(56) References Cited

U.S. PATENT DOCUMENTS

| | | | | |
|---|---|---|---|---|
| 6,388,254 B1* | 5/2002 | Trempala | .................. | G01J 5/02 |
| | | | | 250/338.1 |
| 6,419,387 B1* | 7/2002 | Legrandjacques | ........ | G01J 5/10 |
| | | | | 250/332 |
| 7,111,981 B2* | 9/2006 | Blakeley, III | ............. | G01J 5/02 |
| | | | | 374/121 |
| 7,163,336 B2* | 1/2007 | Blakeley, III | ............. | G01J 5/02 |
| | | | | 374/120 |
| 7,168,316 B2* | 1/2007 | Blakeley, III | ............. | G01J 5/02 |
| | | | | 374/121 |
| 7,339,685 B2* | 3/2008 | Carlson | .................. | G01J 5/025 |
| | | | | 356/614 |
| 7,452,127 B2* | 11/2008 | Blakely, III | ............. | G01J 5/02 |
| | | | | 374/121 |
| 7,520,668 B2* | 4/2009 | Chen | ......................... | G01J 5/02 |
| | | | | 374/121 |
| 7,537,381 B2* | 5/2009 | Hollander | ............... | G01J 5/089 |
| | | | | 374/142 |
| 7,611,278 B2* | 11/2009 | Hollander | ............ | G01J 5/0893 |
| | | | | 374/142 |
| 7,851,758 B1* | 12/2010 | Scanlon | ................ | G01J 5/0896 |
| | | | | 250/330 |
| 8,235,590 B2* | 8/2012 | Sheard | ................. | H04N 5/2253 |
| | | | | 374/130 |
| 8,368,021 B2* | 2/2013 | Stratmann | ............. | G01J 5/0859 |
| | | | | 250/330 |
| 8,468,874 B2* | 6/2013 | Komninos | ............ | G01J 5/0859 |
| | | | | 73/40 |
| 9,360,374 B2* | 6/2016 | Lin | ....................... | G01J 5/0275 |
| 9,541,470 B2* | 1/2017 | Petrucelli | ................. | G01L 17/00 |
| 9,723,229 B2* | 8/2017 | Nguyen | .................... | G01J 5/04 |
| 10,634,632 B2* | 4/2020 | Troy | ........................ | G01S 17/08 |

* cited by examiner

OPTICAL MODULE COMPRISING FIRST OPTICAL COMPONENT AND SECOND OPTICAL COMPONENT AND INFRARED THERMOMETER COMPRISING OPTICAL MODULE

BACKGROUND OF THE INVENTION

1. Field of the Invention

The invention relates to an optical module and an infrared thermometer and, more particularly, to an optical module capable of adjusting an orientation of an optical component and an infrared thermometer equipped with the optical module.

2. Description of the Prior Art

An infrared thermometer uses an infrared sensor to perform measurement for a distant point. Furthermore, the infrared thermometer is usually equipped with a visible laser emitter configured to inform a user which position the infrared sensor is aligned with. When assembling the visible laser emitter, an orientation of an optical axis has to be calibrated to be identical to the infrared sensor as far as possible, such that the position indicated by a laser point is the position measured by the infrared sensor. However, since the size of the laser emitter is very small, the optical axis has to be adjusted by additional and larger precision adjusting tool first. After adjustment, the laser emitter is fixed by glue or the like and then the adjusting tool needs to be removed. Accordingly, the assembly process is very inconvenient.

SUMMARY OF THE INVENTION

An objective of the invention is to provide an optical module capable of adjusting an orientation of an optical component, so as to solve the aforesaid problems.

According to an embodiment of the invention, an optical module comprises a base, a first optical component and at least two washers. The first optical component is disposed on the base and the first optical component has a flange. The at least two washers are disposed on the first optical component and sandwiched in between the base and the flange. Each of the washers has a first side surface and a second side surface, wherein the first side surface and the second side surface tilt with respect to each other by an angle.

According to another embodiment of the invention, an infrared thermometer comprises a casing and an optical module. The optical module is disposed in the casing. The optical module comprises a base, a first optical component, at least two washers and a second optical component. The first optical component is disposed on the base and the first optical component has a flange. The at least two washers are disposed on the first optical component and sandwiched in between the base and the flange. Each of the washers has a first side surface and a second side surface, wherein the first side surface and the second side surface tilt with respect to each other by an angle. The second optical component is disposed with respect to the first optical component. The first optical component is one of a laser emitter and an infrared sensor, and the second optical component is the other one of the laser emitter and the infrared sensor.

As mentioned in the above, the invention disposes at least two washers on the first optical component, such that the washers are sandwiched in between the base and the flange of the first optical component. A user may selectively rotate at least one of the washers, so as to adjust an orientation of the first optical component rapidly and easily by means of the tilt angle included between two side surfaces of the washer without the help of a complicated and external adjusting tool.

These and other objectives of the present invention will no doubt become obvious to those of ordinary skill in the art after reading the following detailed description of the preferred embodiment that is illustrated in the various figures and drawings.

DETAILED DESCRIPTION

Figure 1:
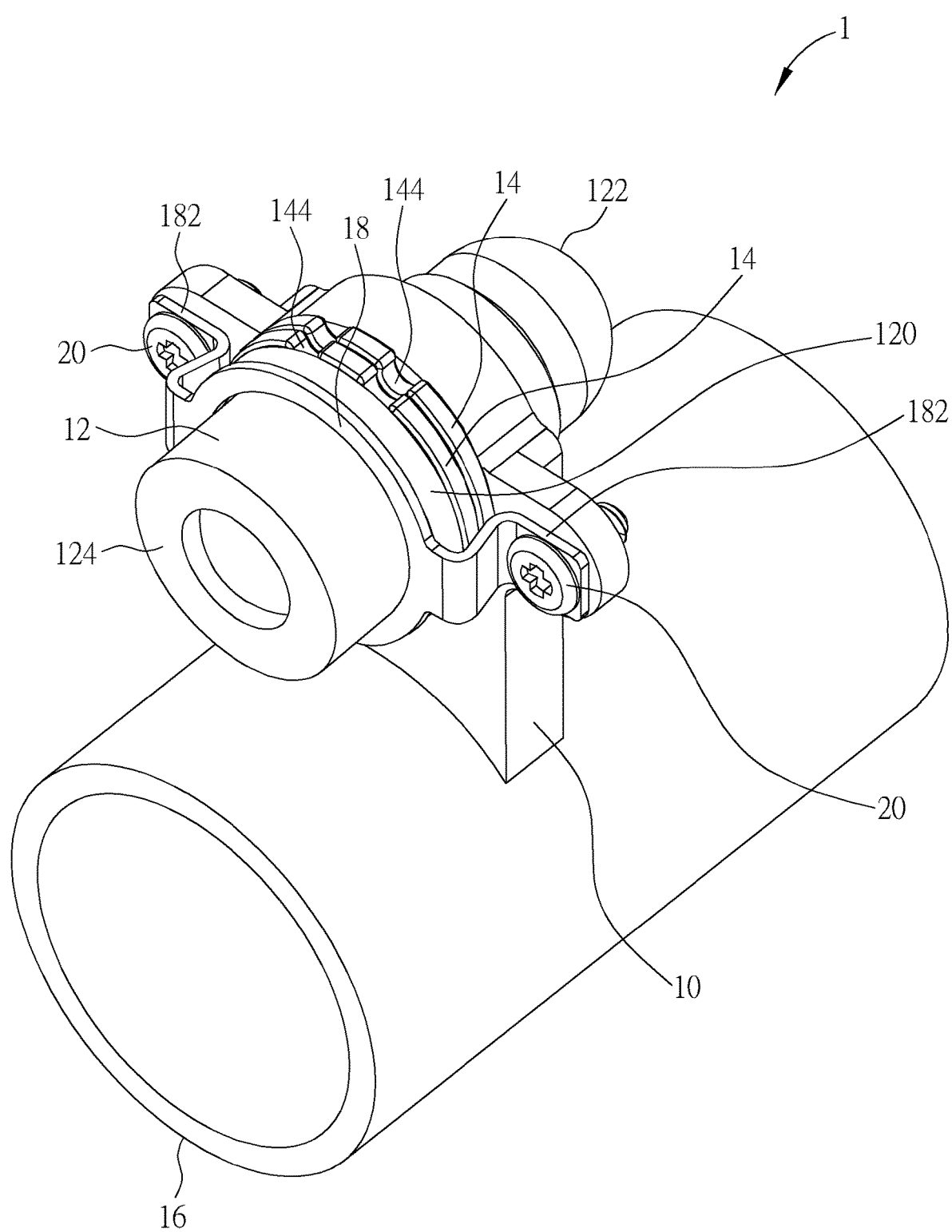
FIG. 1 is a perspective view illustrating an optical module according to an embodiment of the invention.
Figure 2:
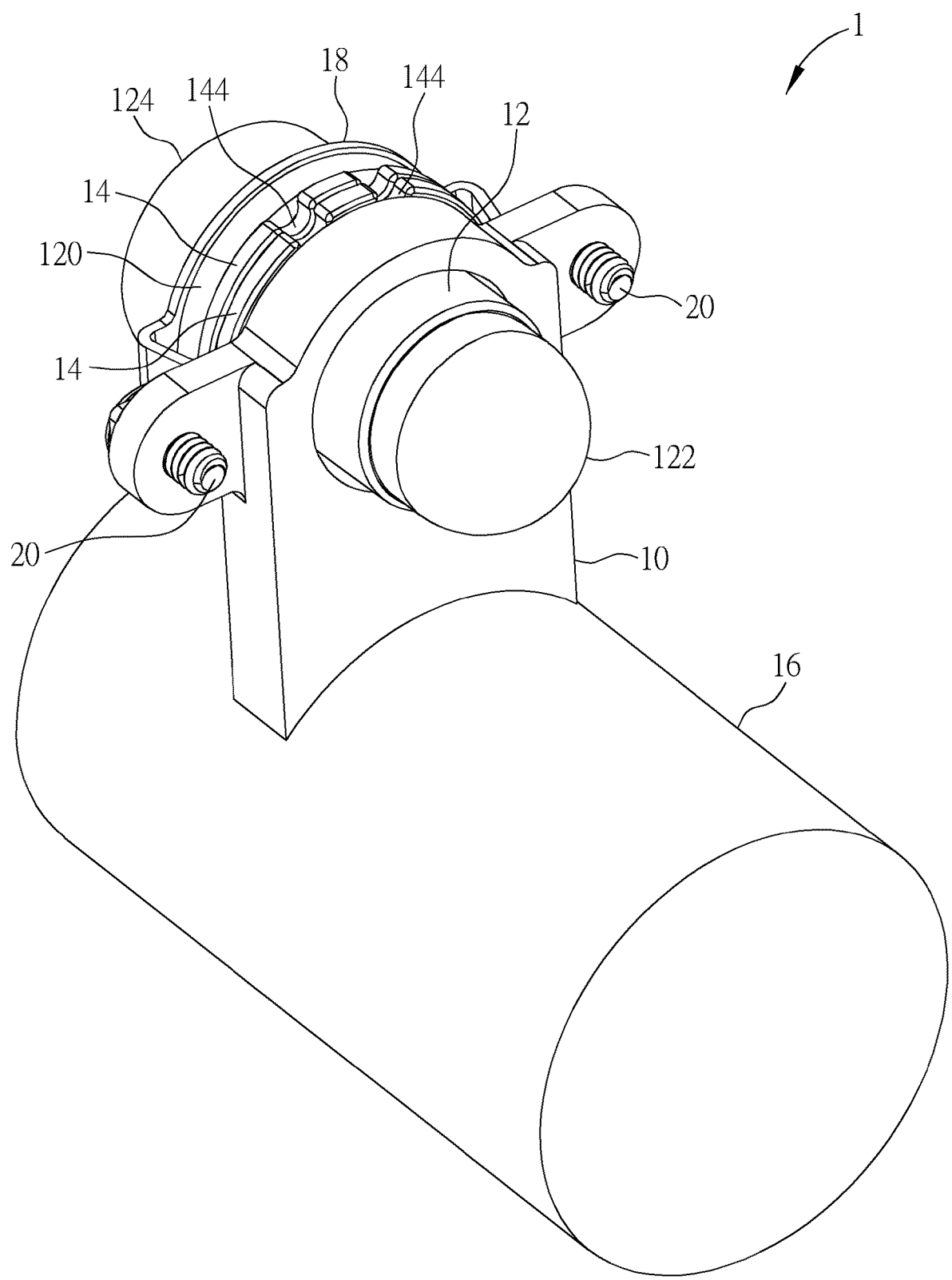
FIG. 2 is a perspective view illustrating the optical module shown in FIG. 1 from another viewing angle.
Figure 3:
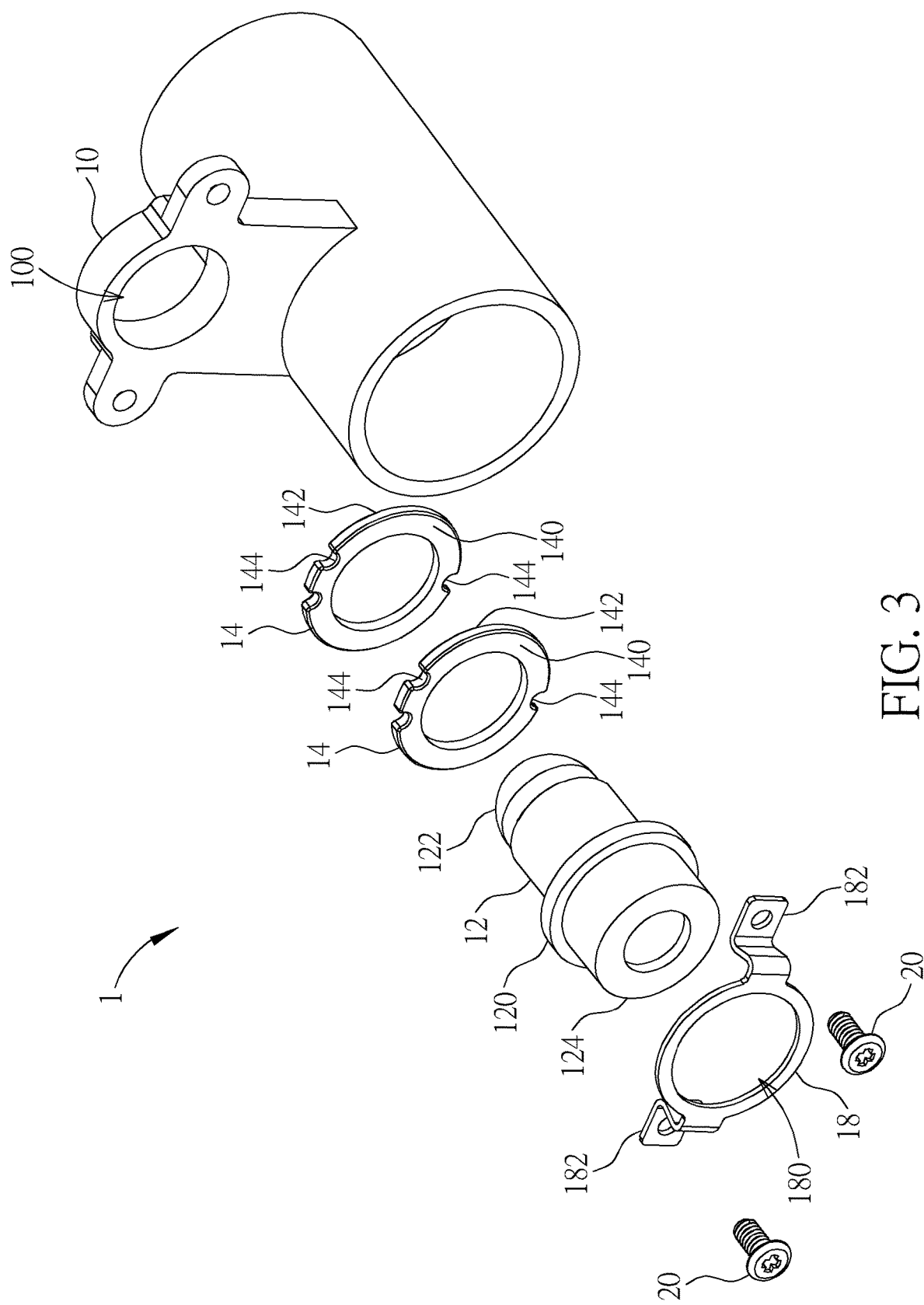
FIG. 3 is an exploded view illustrating the optical module shown in FIG. 1.
Figure 4:
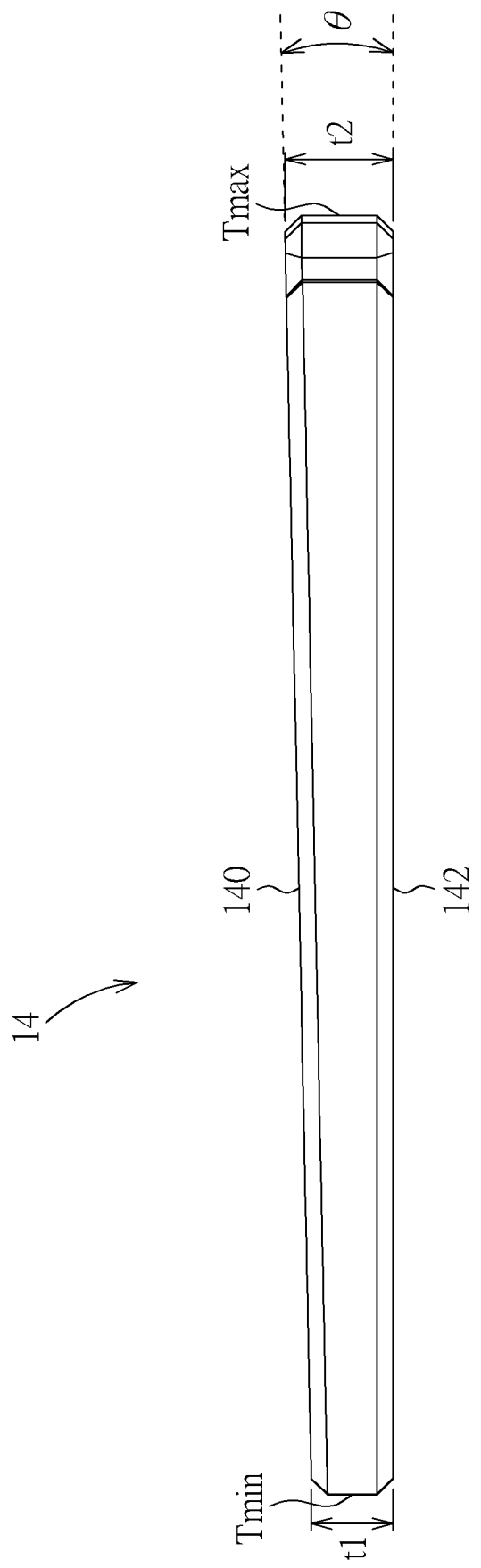
FIG. 4 is a side view illustrating the washer shown in FIG. 1.
Figure 5:
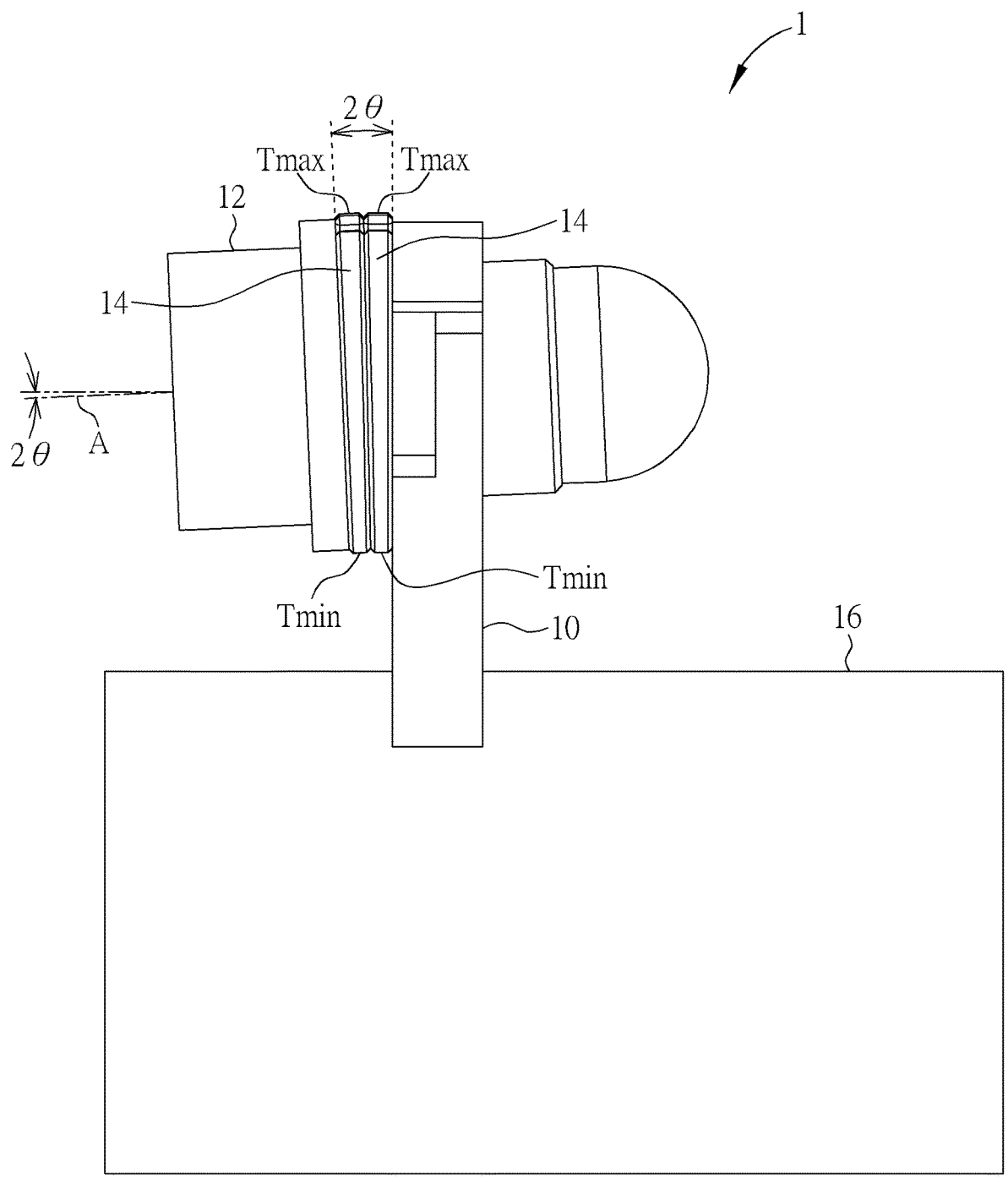
FIG. 5 is a side view illustrating the optical module shown in FIG. 1 without the restraining member and the fixing members.

Referring to FIGS. 1 to 5, FIG. 1 is a perspective view illustrating an optical module 1 according to an embodiment of the invention, FIG. 2 is a perspective view illustrating the optical module 1 shown in FIG. 1 from another viewing angle, FIG. 3 is an exploded view illustrating the optical module 1 shown in FIG. 1, FIG. 4 is a side view illustrating the washer 14 shown in FIG. 1, and FIG. 5 is a side view illustrating the optical module 1 shown in FIG. 1 without a restraining member 18 and a fixing members 20.

As shown in FIGS. 1 to 5, the optical module 1 comprises a base 10, a first optical component 12, at least two washers 14, a second optical component 16, a restraining member 18, and two fixing members 20. In this embodiment, the optical module 1 comprises two washers 14 for illustration purpose. The first optical component 12 may be one of a laser emitter and an infrared sensor, and the second optical component 16 may be the other one of the laser emitter and the infrared sensor. In another embodiment, the first optical component 12 and the second optical component 16 may be light emitting diodes, lenses or other optical components according to practical applications.

In this embodiment, the base 10 may extend from the second optical component 16, but is not so limited. Specifically, the second optical component 16 has a first axial direction and the base 10 extends from an outer wall of the second optical component 16 toward a direction away from the first axial direction. The base 10 has a through hole 100 as shown in FIG. 3. The first optical component 12 has a flange 120 and the flange 120 is located between a first end 122 and a second end 124 of the first optical component 12, wherein the first end 122 is opposite to the second end 124. The restraining member 18 has a through hole 180 and two elastic fixing portions 182. In this embodiment, the restraining member 18 may be, but not limited to, a U-shaped elastic plate. Furthermore, the two fixing members 20 may be, but not limited to, screws.

To assemble the optical module 1, an operator may sequentially dispose the at least two washers 14 on the first optical component 12 from the first end 122 of the first optical component 12 and then insert the first end 122 of the first optical component 12 into the through hole 100 of the base 10. At this time, the first optical component 12 is disposed on the base 10 with respect to the second optical component 16 and the at least two washers 14 are sandwiched in between the base 10 and the flange 120 of the first optical component 12. Then, the operator may insert the second end 124 of the first optical component 12 into the through hole 180 of the restraining member 18, such that the restraining member 18 is disposed on the first optical component 12. Then, the operator may use the two fixing members 20 to fix the two elastic fixing portions 182 of the restraining member 18 on opposite sides of the base 10, respectively. At this time, the restraining member 18 abuts against the flange 120 of the first optical component 12 and is fixed on the base 10, so as to restrain the first optical component 12 and the at least two washers 14 on the base 10, as shown in FIGS. 1 and 2.

As shown in FIG. 4, each of the at least two washers 14 has a first side surface 140 and a second side surface 142, wherein the first side surface 140 and the second side surface 142 tilt with respect to each other by an angle $\theta$, and at least one of the first side surface 140 and the second side surface 142 is a flat surface. In this embodiment, the first side surface 140 and the second side surface 142 both may be flat surfaces. Furthermore, each of the at least two washers 14 has a maximum thickness position Tmax and a minimum thickness position Tmin, wherein the maximum thickness position Tmax and the minimum thickness position Tmin are disposed with respect to each other. In this embodiment, the maximum thickness position Tmax and the minimum thickness position Tmin may have an angle difference of 180 degrees. A thickness of each washer 14 may decrease gradually from the maximum thickness position Tmax to the minimum thickness position Tmin, such that the first side surface 140 and the second side surface 142 tilt with respect to each other by the angle $\theta$. When the washer 14 is viewed from a radial direction of the washer 14, the washer 14 may be trapezoid or trapezoid-like. In this embodiment, an outer diameter of each washer 14, a thickness of the maximum thickness position Tmax, a thickness of the minimum thickness position Tmin, and the angle may satisfy an equation as follows: $t2=t1+(D*\tan\theta)+(D*\tan\theta)$, wherein a sum of $\theta1$ and $\theta2$ is equal to $\theta$, D represents the outer diameter of each washer 14, t2 represents the thickness of the maximum thickness position Tmax, t1 represents the thickness of the minimum thickness position Tmin, $\theta$ represents the angle, $\theta1$ represents an angle included between the first side surface 140 and an axis of the outer diameter (i.e. the radial direction of the washer 14), and $\theta2$ represents an angle included between the second side surface and the axis of the outer diameter. When $\theta1=0$ or $\theta2=0$, $t2=t1+(D*\tan\theta)$. At this time, the washer 14 is a right-angled trapezoid (as shown in FIG. 4) as the washer 14 is viewed from the radial direction of the washer 14. When $\theta1=\theta2=\theta/2$, $t2=t1+2*[D*\tan(\theta/2)]$. At this time, the washer 14 is an isosceles trapezoid as the washer 14 is viewed from the radial direction of the washer 14. When $\theta1\neq\theta2$, $\theta1\neq0$ and $\theta2\neq0$, $t2=t1+(D*\tan\theta1)+(D*\tan\theta2)$. At this time, the washer 14 is a general trapezoid as the washer 14 is viewed from the radial direction of the washer 14. It may be preferred that $\theta1=0$ or $\theta2=0$, such that only one surface of the washer 14 needs to be ground in the process of manufacturing the washer 14. Accordingly, the process of manufacturing the washer 14 may be simplified.

Each of the washers 14 has at least one operating portion 144, wherein the operating portion 144 is configured to rotate the washer 14 by a user. The operating portion 144 may be disposed with respect to at least one of the maximum thickness position Tmax and the minimum thickness position Tmin, such that the user may recognize the maximum thickness position Tmax and/or the minimum thickness position Tmin by the operating portion 144. In this embodiment, each of the washers 14 may have three operating portions 144, wherein two of the operating portions 144 may be disposed with respect to the maximum thickness position Tmax and one of the operating portions 144 may be disposed with respect to the minimum thickness position Tmin. Needless to say, the invention may only disposed the operating portion 144 with respect to the maximum thickness position Tmax or only disposed the operating portion 144 with respect to the minimum thickness position Tmin according to practical applications.

In this embodiment, the operating portion 144 may be an indentation. Accordingly, the user may use a finger or a tool (e.g. a rod) to push the operating portion 144 to rotate the washer 14. When the user wants to adjust an orientation of the first optical component 12, the user may release the fixing members 20 first without detaching the fixing members 20 from the base 10. Then, the user may rotate at least one of the two washers 14 to adjust the orientation of the first optical component 12 by means of the cooperation between the maximum thickness positions Tmax and the minimum thickness positions Tmin of the two washers 14. In this embodiment, when an angle difference between the minimum thickness positions Tmin of the two washers 14 is 180 degrees (i.e. the minimum thickness positions Tmin of the two washers 14 are located at opposite sides of the first optical component 12, respectively, wherein the maximum thickness position Tmax of one washer 14 and the minimum thickness position Tmin of the other washer 14 rotate to an identical position), a total thickness of the two washers is identical at any position. At this time, a tilt angle of an optical axis A of the first optical component 12 is 0 degree, wherein the optical axis A with 0 degree tilt angle is defined as a reference axis. As shown in FIG. 5, when an angle difference between the minimum thickness positions Tmin of the two washers 14 is 0 degree (i.e. the minimum thickness positions Tmin of the two washers 14 rotate to an identical position), the optical axis A of the first optical component 12 tilts toward the minimum thickness positions Tmin by $2\theta$ degrees with respect to the reference axis. Accordingly, when an angle difference between the minimum thickness positions Tmin of the two washers 14 is between 0 degree and 180 degrees, the tilt angle of the optical axis A of the first optical component 12 may be adjusted between 0 degree and $2\theta$ degrees with respect to the reference axis. At this time, the optical axis A of the first optical component 12 tilts toward an average azimuth angle of the minimum thickness positions Tmin of the two washers 14.

After adjusting the orientation of the first optical component 12, the user may screw the fixing members 20 tightly to fix the tilt angle and the tilt direction of the optical axis A of the first optical component 12. In another embodiment, after screwing the fixing members 20 tightly, all components may be further fixed by adhesive. In practical applications, the optical module 1 may comprise three or more than three identical washers 14. At this time, the minimum tilt angle of the optical axis A of the first optical component 12 with respect to the reference axis is 0 and the maximum tilt angle is equal to a product of the number of washers 14 and θ degrees. It should be noted that the manner of adjusting the washer 14 to change the tilt angle of the optical axis A has been mentioned in the above, so it will not be depicted herein again.

Figure 6:
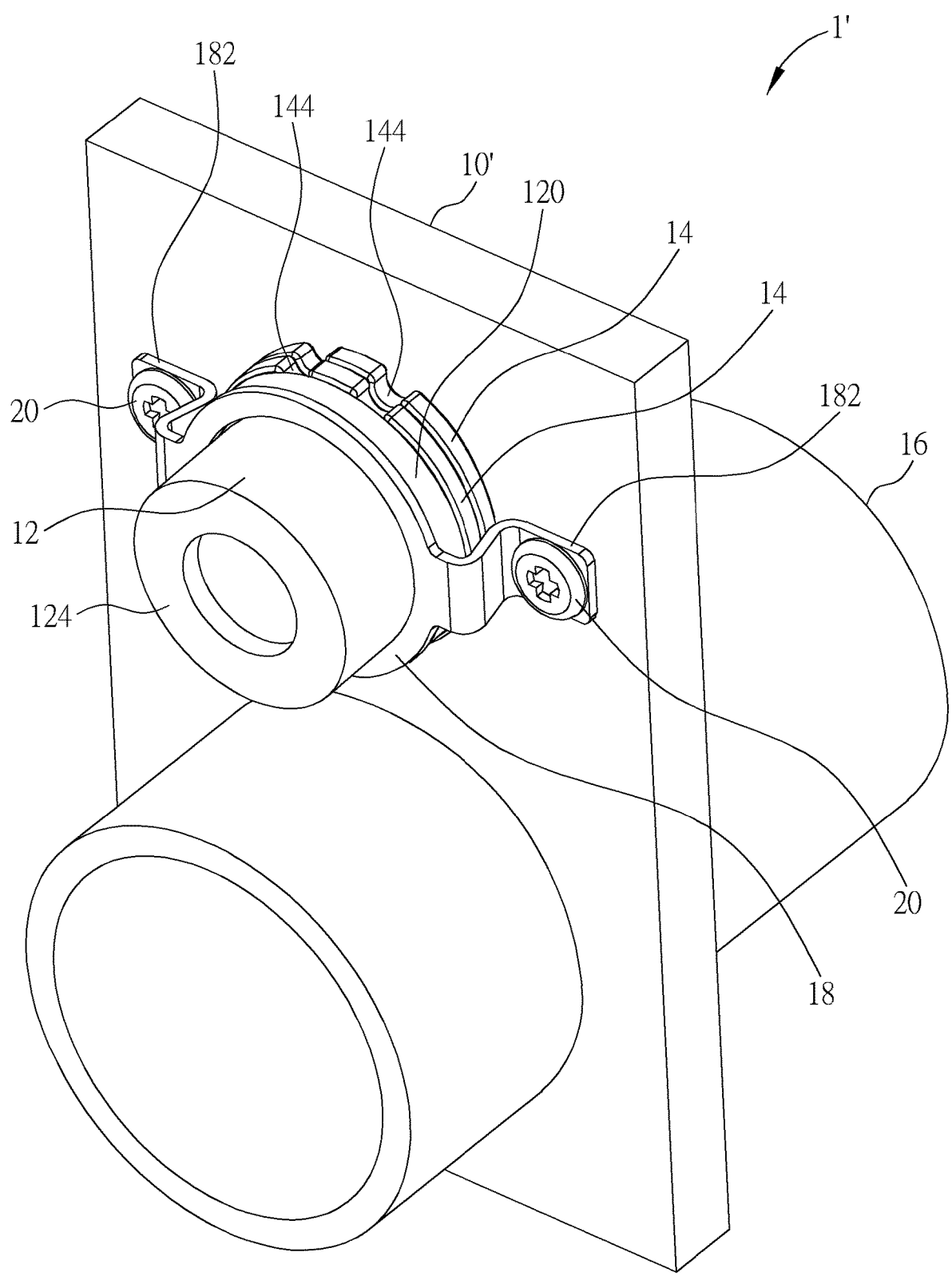
FIG. 6 is a perspective view illustrating an optical module according to another embodiment of the invention.

Referring to FIG. 6, FIG. 6 is a perspective view illustrating an optical module 1' according to another embodiment of the invention. The main difference between the optical module 1' and the aforesaid optical module 1 is that the first optical component 12 and the second optical component 16 of the optical module 1' are disposed on an identical base 10', as shown in FIG. 6. In other words, the invention may dispose the first optical component 12 on the base 10 extending from the second optical component 16 or dispose the first optical component 12 and the second optical component 16 together on the individual base 10' according to practical applications.

Figure 7:
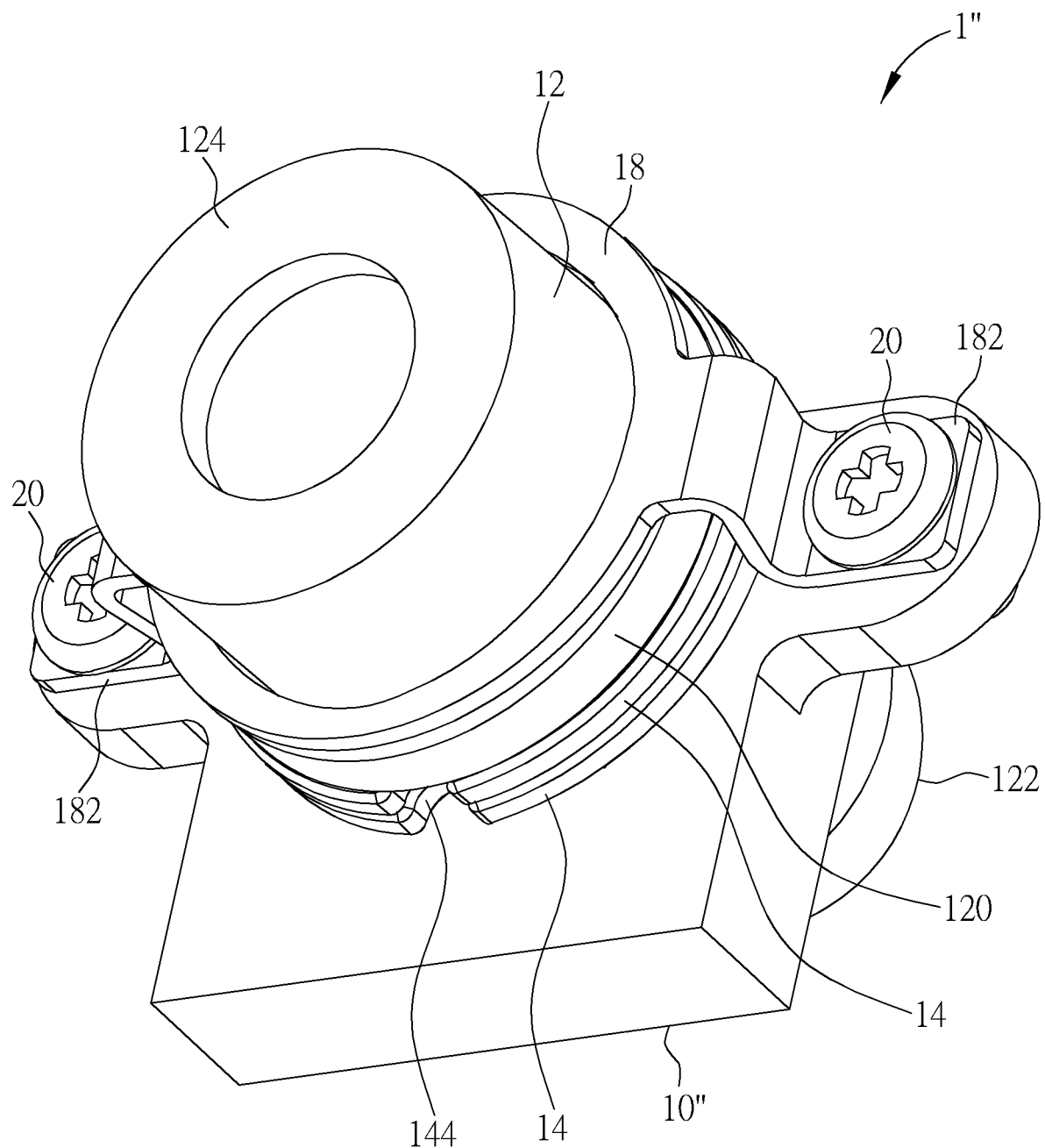
FIG. 7 is a perspective view illustrating an optical module according to another embodiment of the invention.

Referring to FIG. 7, FIG. 7 is a perspective view illustrating an optical module 1" according to another embodiment of the invention. The main difference between the optical module 1" and the aforesaid optical module 1 is that the first optical component 12 of the optical module 1" is disposed on a base 10" alone, as shown in FIG. 7. In other words, the invention may adjust the orientation of the first optical component 12 independently without cooperating with the second optical component 16.

Figure 8:
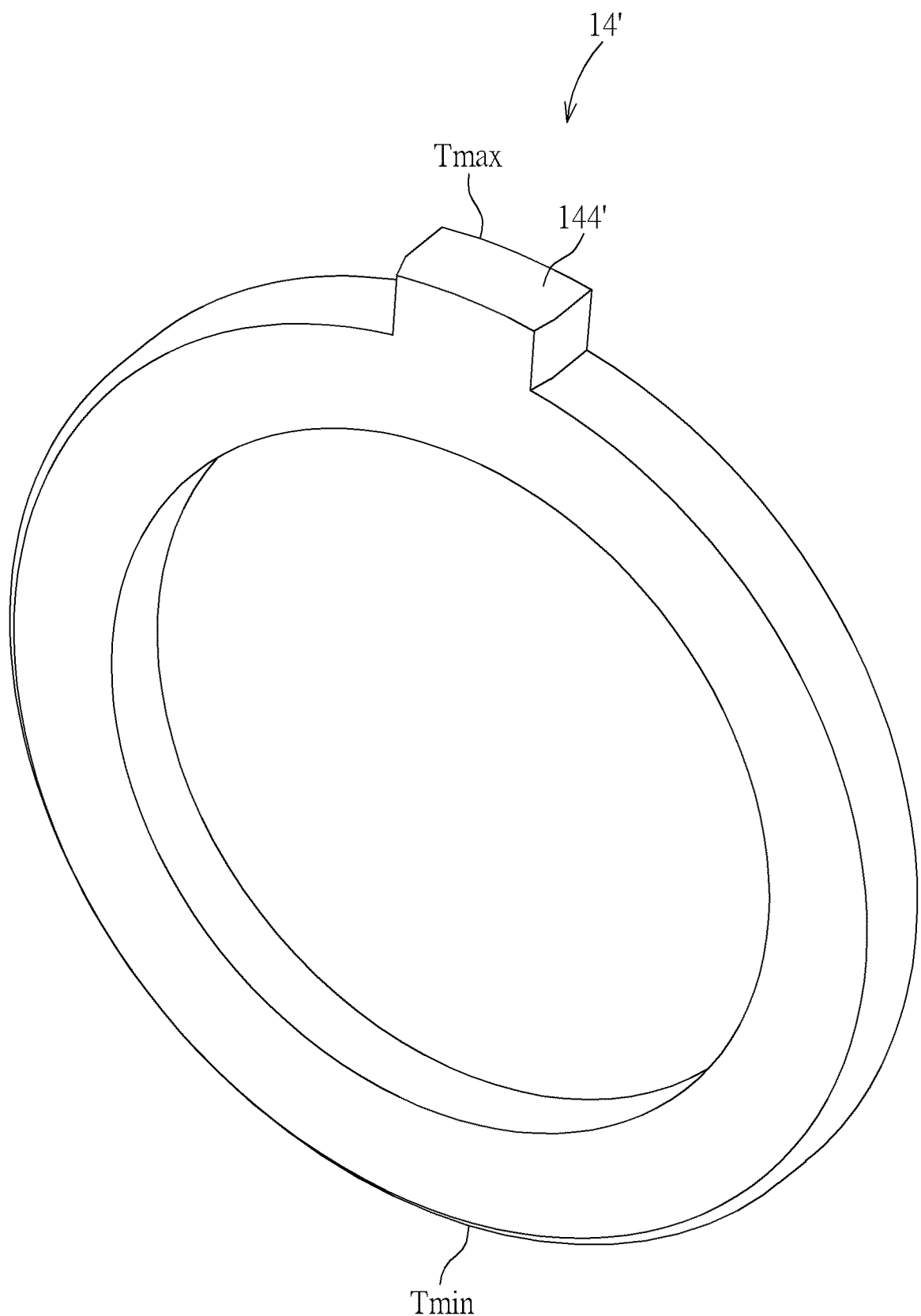
FIG. 8 is a perspective view illustrating a washer according to another embodiment of the invention.

Referring to FIG. 8, FIG. 8 is a perspective view illustrating a washer 14' according to another embodiment of the invention. The main difference between the washer 14' and the aforesaid washer 14 is that an operating portion 144' of the washer 14' is a protrusion, as shown in FIG. 8. In this embodiment, the washer 14' may have one operating portion 144', wherein the operating portion 144' may be disposed with respect to the maximum thickness position Tmax. Needless to say, the operating portion 144' may also be disposed with respect to the minimum thickness position Tmin according to practical applications.

Figure 9:
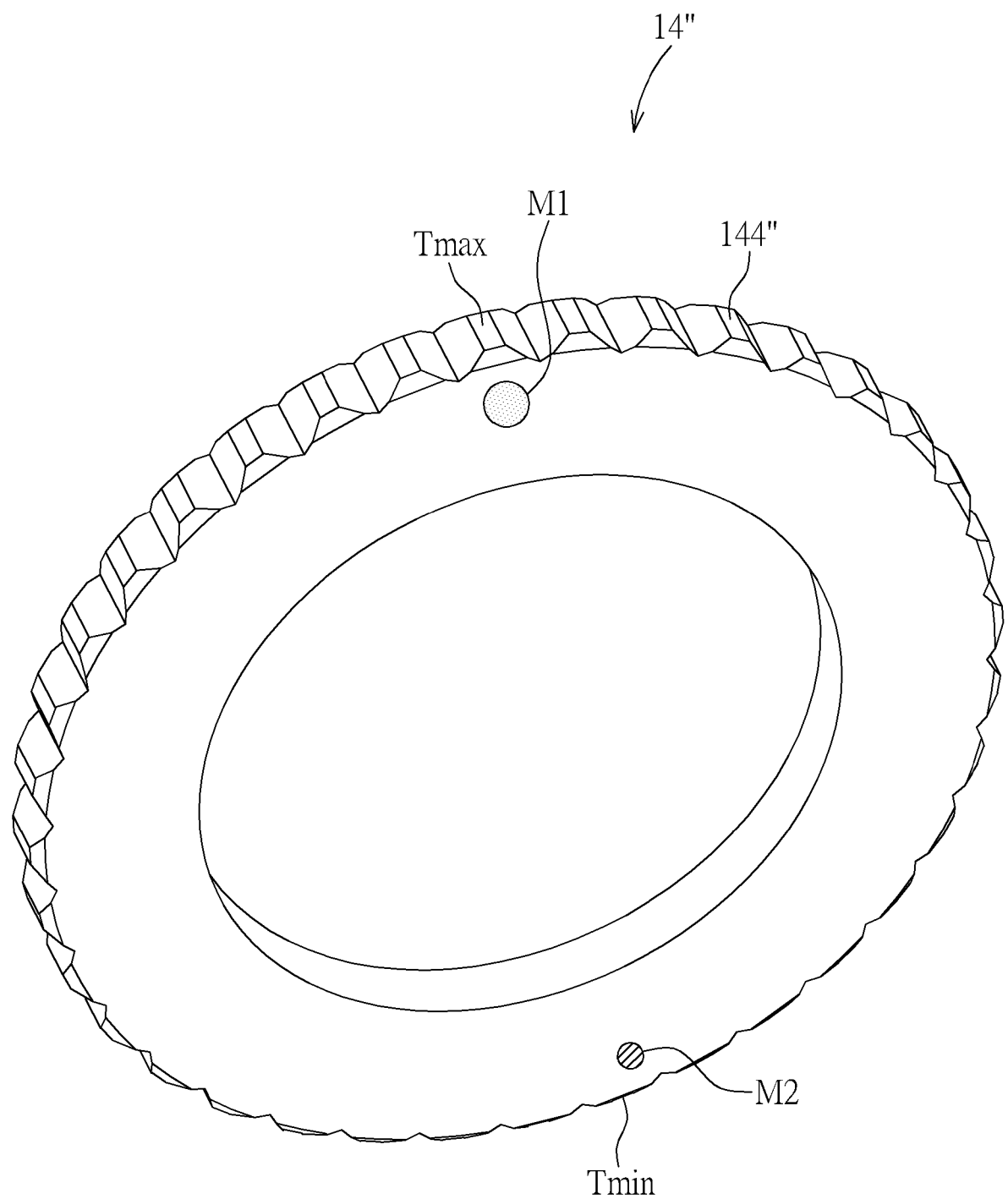
FIG. 9 is a perspective view illustrating a washer according to another embodiment of the invention.

Referring to FIG. 9, FIG. 9 is a perspective view illustrating a washer 14" according to another embodiment of the invention. The main difference between the washer 14" and the aforesaid washer 14 is that an operating portion 144" of the washer 14" is an embossed structure, as shown in FIG. 9. In this embodiment, the operating portion 144" is an embossed structure surrounding a periphery of the washer 14". Furthermore, the washer 14" may have at least one mark, wherein the mark may be disposed with respect to at least one of the maximum thickness position Tmax and the minimum thickness position Tmin, such that the user may recognize the maximum thickness position Tmax and/or the minimum thickness position Tmin by the mark. In this embodiment, the washer 14" may have two marks M1, M2, wherein the mark M1 may be disposed with respect to the maximum thickness position Tmax and the mark M2 may be disposed with respect to the minimum thickness position Tmin.

It should be noted that the aforesaid operating portions 144, 144' may also be disposed at any position of the washers 14, 14' and at least one mark M1, M2 shown in FIG. 9 may be disposed with respect to at least one of the maximum thickness position Tmax and the minimum thickness position Tmin.

Figure 10:
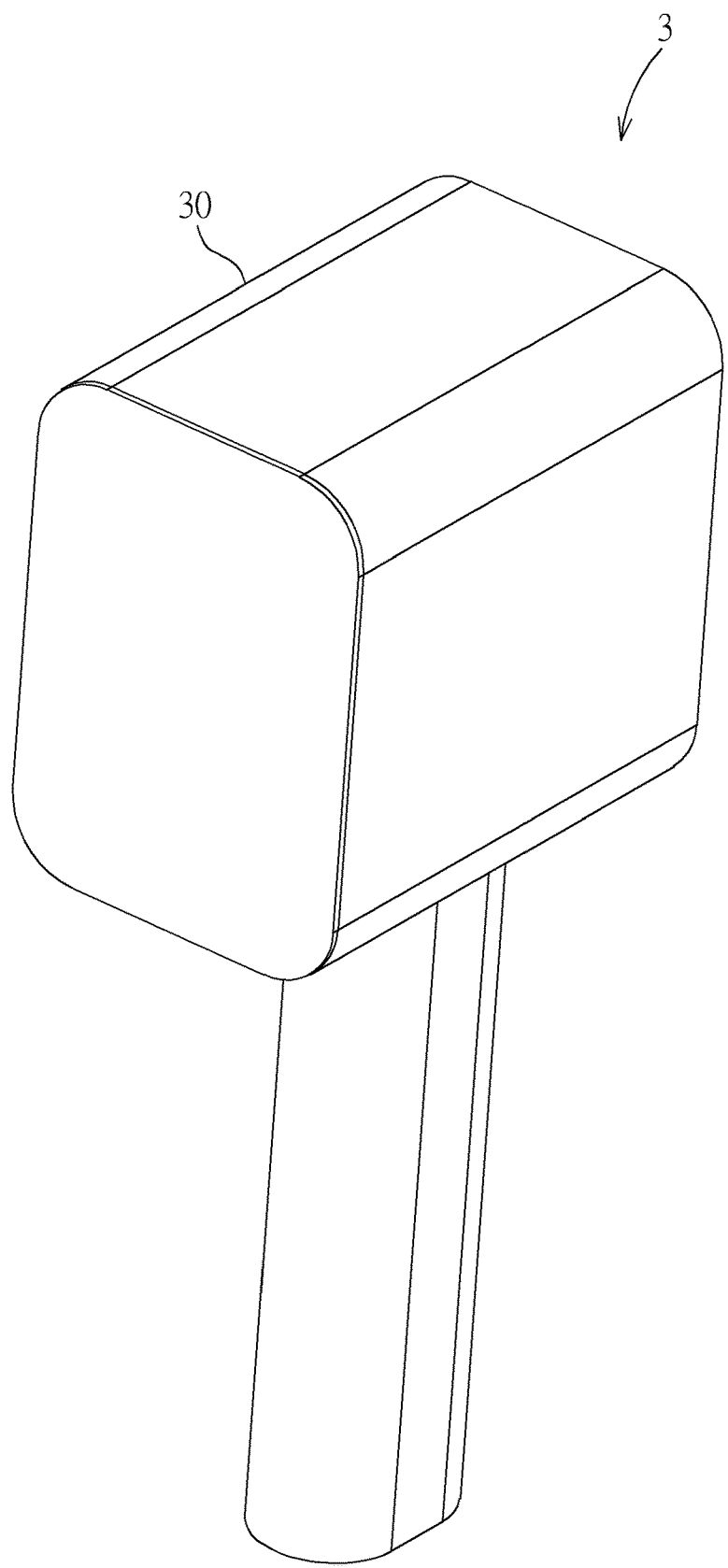
FIG. 10 is a perspective view illustrating an infrared thermometer according to another embodiment of the invention.
Figure 11:
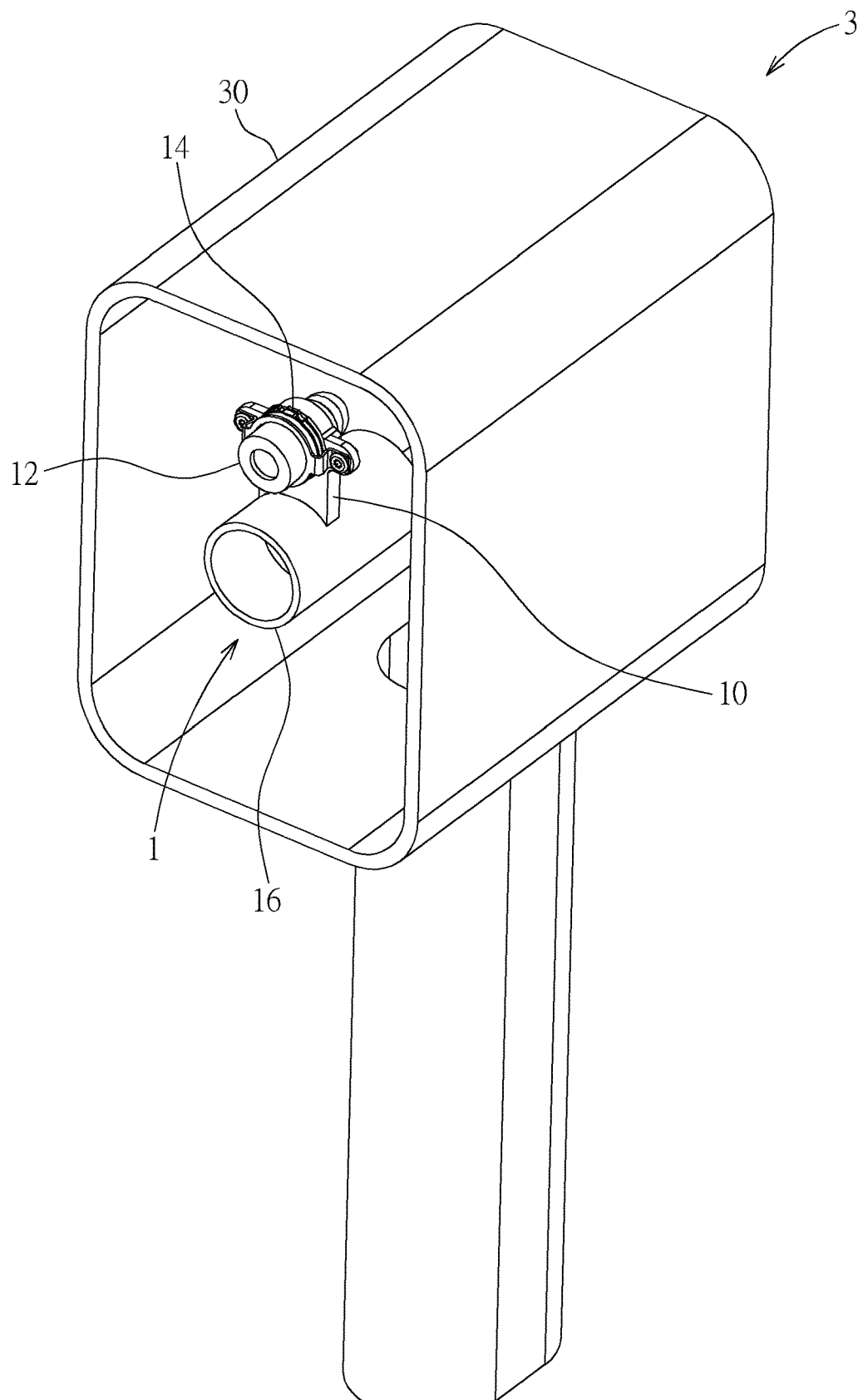
FIG. 11 is a perspective view illustrating the inside of the infrared thermometer shown in FIG. 10.

Referring to FIGS. 10 and 11, FIG. 10 is a perspective view illustrating an infrared thermometer 3 according to another embodiment of the invention and FIG. 11 is a perspective view illustrating the inside of the infrared thermometer 3 shown in FIG. 10. As shown in FIGS. 10 and 11, the infrared thermometer 3 comprises a casing 30 and the aforesaid optical module 1, wherein the optical module 1 is disposed in the casing 30. In general, the infrared thermometer 3 may be further equipped with some necessary hardware or software components for specific purposes, such as a controller, a memory, a power supply, applications, a communication module, etc., and it depends on practical applications. In another embodiment, the optical module 1 may also be replaced by the optical module 1' shown in FIG. 6. In another embodiment, the optical module 1 may also be replaced by the optical module 1" shown in FIG. 7. It should be noted that when the optical module 1 is replaced by the optical module 1" shown in FIG. 7, the second optical component 16 may be disposed in the casing 30 with respect to the first optical component 12 and the second optical component 16 may be fixed to a specific structure in the casing 30.

In this embodiment, the first optical component 12 may be one of a laser emitter and an infrared sensor, and the second optical component 16 may be the other one of the laser emitter and the infrared sensor. For example, when the first optical component 12 is a laser emitter and the second optical component 16 is an infrared sensor, the washer 14 may be rotated to adjust an orientation of the laser emitter with respect to the infrared sensor; and when the first optical component 12 is an infrared sensor and the second optical component 16 is a laser emitter, the washer 14 may be rotated to adjust an orientation of the infrared sensor with respect to the laser emitter.

As mentioned in the above, the invention disposes at least two washers on the first optical component, such that the washers are sandwiched in between the base and the flange of the first optical component. A user may selectively rotate at least one of the washers, so as to adjust an orientation of the first optical component rapidly and easily by means of the tilt angle included between two side surfaces of the washer without the help of a complicated and external adjusting tool.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. An optical module comprising:
   a base;
   a first optical component disposed on the base, the first optical component having a flange; and
   at least two washers disposed on the first optical component and sandwiched in between the base and the flange, each washer of the at least two washers having a first side surface and a second side surface, the first side surface and the second side surface tilting with respect to each other by an angle.

2. The optical module of claim 1, wherein each washer of the at least two washers has a maximum thickness position and a minimum thickness position, the maximum thickness position and the minimum thickness position are disposed with respect to each other, and a thickness of each washer of the at least two washers decreases gradually from the maximum thickness position to the minimum thickness position, such that the first side surface and the second side surface tilt with respect to each other by the angle.

3. The optical module of claim 2, wherein an outer diameter of each washer of the at least two washers, a thickness of the maximum thickness position, a thickness of the minimum thickness position, and the angle satisfy an equation as follows:

t2=t1+(D*tan θ);

wherein D represents the outer diameter of each washer of the at least two washers, t2 represents the thickness of the maximum thickness position, t1 represents the thickness of the minimum thickness position, and θ represents the angle.

4. The optical module of claim 2, wherein an outer diameter of each washer of the at least two washers, a thickness of the maximum thickness position, a thickness of the minimum thickness position, and the angle satisfy an equation as follows:

t2=t1+(D*tan θ1)+(D*tan θ2);

wherein a sum of θ1 and θ2 is equal to θ, D represents the outer diameter of each washer of the at least two washers, t2 represents the thickness of the maximum thickness position, t1 represents the thickness of the minimum thickness position, θ represents the angle, θ1 represents an angle included between the first side surface and an axis of the outer diameter, and θ2 represents an angle included between the second side surface and the axis of the outer diameter.

5. The optical module of claim 1, further comprising a second optical component, the base extending from the second optical component.

6. The optical module of claim 1, further comprising a second optical component disposed on the base.

7. The optical module of claim 1, wherein each washer of the at least two washers has at least one operating portion configured to rotate each washer of the at least two washers.

8. The optical module of claim 7, wherein each washer of the at least two washers has a maximum thickness position and a minimum thickness position, and the at least one operating portion is disposed with respect to at least one of the maximum thickness position and the minimum thickness position.

9. The optical module of claim 1, wherein each washer of the at least two washers has a maximum thickness position, a minimum thickness position, and at least one mark disposed with respect to at least one of the maximum thickness position and the minimum thickness position.

10. The optical module of claim 1, further comprising a restraining member abutting against the flange and fixed on the base, so as to restrain the first optical component and the at least two washers on the base.

11. The optical module of claim 10, further comprising two fixing members, the restraining member having two elastic fixing portions, the two fixing members fixing the two elastic fixing portions on the base.

12. An infrared thermometer comprising:
  a casing; and
  an optical module disposed in the casing, the optical module comprising:
    a base;
    a first optical component disposed on the base, the first optical component having a flange;
    at least two washers disposed on the first optical component and sandwiched in between the base and the flange, each washer of the at least two washers having a first side surface and a second side surface, the first side surface and the second side surface tilting with respect to each other by an angle; and
    a second optical component disposed with respect to the first optical component;
    wherein the first optical component comprises one of a laser emitter and an infrared sensor, and the second optical component comprises another one of the laser emitter and the infrared sensor.

13. The infrared thermometer of claim 12, wherein each washer of the at least two washers has a maximum thickness position and a minimum thickness position, the maximum thickness position and the minimum thickness position are disposed with respect to each other, and a thickness of each washer of the at least two washers decreases gradually from the maximum thickness position to the minimum thickness position, such that the first side surface and the second side surface tilt with respect to each other by the angle.

14. The infrared thermometer of claim 13, wherein an outer diameter of each washer of the at least two washers, a thickness of the maximum thickness position, a thickness of the minimum thickness position, and the angle satisfy an equation as follows:

t2=t1+(D*tan θ);

wherein D represents the outer diameter of each washer of the at least two washers, t2 represents the thickness of the maximum thickness position, t1 represents the thickness of the minimum thickness position, and θ represents the angle.

15. The infrared thermometer of claim 13, wherein an outer diameter of each washer of the at least two washers, a thickness of the maximum thickness position, a thickness of the minimum thickness position, and the angle satisfy an equation as follows:

t2=t1+(D*tan θ1)+(D*tan θ2);

wherein a sum of θ1 and θ2 is equal to θ, D represents the outer diameter of each washer of the at least two washers, t2 represents the thickness of the maximum thickness position, t1 represents the thickness of the minimum thickness position, θ represents the angle, θ1 represents an angle included between the first side surface and an axis of the outer diameter, and θ2 represents an angle included between the second side surface and the axis of the outer diameter.

16. The infrared thermometer of claim 12, wherein the base extends from the second optical component.

17. The infrared thermometer of claim 12, wherein the second optical component is disposed on the base.

18. The infrared thermometer of claim 12, wherein each washer of the at least two washers has at least one operating portion configured to rotate each washer of the at least two washers.

19. The infrared thermometer of claim 18, wherein each washer of the at least two washers has a maximum thickness position and a minimum thickness position, and the at least one operating portion is disposed with respect to at least one of the maximum thickness position and the minimum thickness position.

20. The infrared thermometer of claim 12, wherein each washer of the at least two washers has a maximum thickness position, a minimum thickness position, and at least one mark disposed with respect to at least one of the maximum thickness position and the minimum thickness position.

21. The infrared thermometer of claim 12, wherein the optical module further comprises a restraining member abutting against the flange and fixed on the base, so as to restrain the first optical component and the at least two washers on the base.

22. The infrared thermometer of claim 21, wherein the optical module further comprising two fixing members, the restraining member has two elastic fixing portions, and the two fixing members fix the two elastic fixing portions on the base.

\* \* \* \* \*